(12) United States Patent
Nakabayashi et al.

(10) Patent No.: US 7,567,412 B2
(45) Date of Patent: Jul. 28, 2009

(54) MAGNETIC SENSING ELEMENT WITH IMPROVED MAGNETIC SENSITIVITY STABILITY AND METHOD FOR PRODUCING THE SAME

(75) Inventors: Ryo Nakabayashi, Niigaka-ken (JP); Eiji Umetsu, Niigaka-ken (JP); Kazuaki Ikarashi, Niigaka-ken (JP); Fumihito Koike, Niigata-ken (JP); Naoya Hasegawa, Niigaka-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 500 days.

(21) Appl. No.: 11/266,956

(22) Filed: Oct. 26, 2005

(65) Prior Publication Data

US 2006/0110625 A1   May 25, 2006

(30) Foreign Application Priority Data

Oct. 28, 2004 (JP) ............................. 2004-314604

(51) Int. Cl.
*G11B 5/39* (2006.01)
(52) U.S. Cl. .................. 360/324.12; 428/811; 428/816
(58) Field of Classification Search ....................... None
See application file for complete search history.

(56) References Cited

U.S. PATENT DOCUMENTS

| | | | | |
|---|---|---|---|---|
| 6,127,045 A * | 10/2000 | Gill | ............................. | 428/611 |
| 6,635,366 B2 | 10/2003 | Sato et al. | | |
| 6,674,617 B2 * | 1/2004 | Gill | ........................ | 360/324.12 |
| 6,693,775 B1 | 2/2004 | Gill | | |
| 6,816,347 B2 * | 11/2004 | Koi et al. | ................ | 360/324.11 |
| 7,499,248 B2 * | 3/2009 | Ishizone et al. | ........ | 360/324.12 |
| 2004/0041679 A1 | 3/2004 | Saito et al. | | |
| 2004/0179311 A1 | 9/2004 | Li et al. | | |
| 2005/0276099 A1 * | 12/2005 | Horng et al. | ................. | 365/158 |
| 2008/0030907 A1 * | 2/2008 | Nakabayashi et al. | .. | 360/324.12 |

FOREIGN PATENT DOCUMENTS

JP    2001-167410    6/2001
WO   WO 00/65578    11/2000

* cited by examiner

*Primary Examiner*—Kevin M Bernatz
(74) *Attorney, Agent, or Firm*—Brinks Hofer Gilson & Lione

(57) ABSTRACT

A magnetic sensing element includes a free magnetic layer having a three-layer structure including a first enhancement layer in contact with a nonmagnetic material layer, a second enhancement layer, and a low-coercivity layer. The second enhancement layer has a lower magnetostriction coefficient $\lambda$ than the first enhancement layer. If such an enhancement layer having a bilayer structure is used, rather than a known monolayer structure, and the second enhancement layer has a lower magnetostriction coefficient $\lambda$ than the first enhancement layer, the rate of change in magnetoresistance of the magnetic sensing element can be increased with no increase in the magnetostriction coefficient $\lambda$ of the free magnetic layer.

12 Claims, 13 Drawing Sheets

MAGNETIC SENSING ELEMENT WITH IMPROVED MAGNETIC SENSITIVITY STABILITY AND METHOD FOR PRODUCING THE SAME

BACKGROUND OF THE INVENTION

1. Field of the Invention

The present invention relates to magnetic sensing elements that sense external magnetic fields as changes in resistance and methods for producing the magnetic sensing elements, and particularly relates to a magnetic sensing element with improved magnetic sensitivity stability and a method for producing the magnetic sensing element.

2. Description of the Related Art

FIG. 13 is a partial sectional view of a known magnetic sensing element (spin-valve thin-film element) which is taken in a direction parallel to the surface of the magnetic sensing element facing a recording medium.

In FIG. 13, a seed layer 2 made of a face-centered cubic (fcc) metal, such as NiFeCr, is formed on a base layer 1 made of Ta.

An antiferromagnetic layer 3, a pinned magnetic layer 4, a nonmagnetic material layer 5, a free magnetic layer 6, and a protective layer 7 are sequentially formed on the seed layer 2 to constitute a multilayer film T.

The protective layer 7 is made of Ta. The free magnetic layer 6 has a bilayer structure including a $Co_{90}Fe_{10}$ layer 6a and a NiFe layer 6b. The nonmagnetic material layer 5 is made of Cu. The pinned magnetic layer 4 is made of CoFe. The antiferromagnetic layer 3 is made of PtMn.

Electrode layers 10 are provided on both sides of the multilayer film T to allow a direct sensing current to flow in a direction parallel to the surfaces of the multilayer film T.

An exchange coupling magnetic field occurs at the interface between the antiferromagnetic layer 3 and the pinned magnetic layer 4 to pin the magnetization of the pinned magnetic layer 4 in a height direction (the Y1 direction in the drawing).

Hard bias layers 8 made of a hard magnetic material, such as CoPt, are formed on both sides of the free magnetic layer 6. The hard bias layers 8 generate a longitudinal bias field to align the magnetization of the free magnetic layer 6 in a track-width direction (the X1-X2 direction in the drawing).

An external magnetic field applied to the magnetic sensing element shown in FIG. 13 changes the magnetization direction of the free magnetic layer 6 relative to that of the pinned magnetic layer 4 to change the resistance of the multilayer film T. While a predetermined sensing current is allowed to flow through the multilayer film T, the magnetic sensing element senses the change in resistance as a change in voltage to detect the external magnetic field.

The free magnetic layer 6 of the magnetic sensing element shown in FIG. 13 has a bilayer structure in which the NiFe layer 6b is formed on the $Co_{90}Fe_{10}$ layer 6a. The NiFe layer 6b has lower coercivity than the $Co_{90}Fe_{10}$ layer 6a.

$Co_{90}Fe_{10}$ has a high spin-dependent scattering coefficient, which increases with increasing amount of change in the mean free path of conduction electrons which occurs when the magnetization direction of the free magnetic layer 6 shifts from parallel to antiparallel to that of the pinned magnetic layer 4. That is, as the spin-dependent scattering coefficient of the material for the free magnetic layer 6 increases, the rate of change in magnetoresistance increases.

As shown in FIG. 13, the $Co_{90}Fe_{10}$ layer 6a of the free magnetic layer 6 may be formed on the nonmagnetic material layer 5 to increase the spin-dependent scattering coefficient of the free magnetic layer 6 and thus increase the rate of change in magnetoresistance. Such a magnetic sensing element is disclosed in, for example, Japanese Unexamined Patent Application Publication Nos. 2001-167410 (Patent Document 1, see Page 2 of this document) and 2003-174217 (Patent Document 2, see Page 3 of this document).

The rate of change in magnetoresistance of the magnetic sensing element may be increased by increasing the thickness of the $Co_{90}Fe_{10}$ layer 6a in contact with the nonmagnetic material layer 5. Simply increasing the thickness of the $Co_{90}Fe_{10}$ layer 6a, however, magnifies the magnetostriction of the $Co_{90}Fe_{10}$ layer 6a because $Co_{90}Fe_{10}$ also has a high magnetostriction coefficient λ, thus causing phenomena such as decreased output symmetry and increased Barkhausen noise. Such phenomena undesirably degrade the output stability of the magnetic sensing element.

SUMMARY OF THE INVENTION

An object of the present invention is to solve the above problems in the related art and provide a magnetic sensing element having a higher rate of change in magnetoresistance with no increase in the magnetostriction coefficient of the free magnetic layer.

The present invention provides a magnetic sensing element including a multilayer film including a pinned magnetic layer whose magnetization direction is pinned in one direction and a free magnetic layer formed on the pinned magnetic layer with a nonmagnetic material layer disposed therebetween. The free magnetic layer includes a low-coercivity layer and an enhancement layer made of a material having a higher spin-dependent scattering coefficient than the material for the low-coercivity layer. The enhancement layer is disposed closer to the nonmagnetic material layer than the low-coercivity layer. The enhancement layer includes a first enhancement layer and a second enhancement layer. The first enhancement layer is disposed closer to the nonmagnetic material layer than the second enhancement layer. The overall enhancement layer has a lower magnetostriction coefficient λ in absolute value than the first enhancement layer.

In the present invention, the enhancement layer stacked on the low-coercivity layer, which has lower coercivity than the enhancement layer, has a bilayer structure, rather than a known monolayer structure. The first enhancement layer is disposed closer to the nonmagnetic material layer than the second enhancement layer. The overall enhancement layer has a lower magnetostriction coefficient λ in absolute value than the first enhancement layer. The magnetic sensing element can therefore achieve a higher rate of change in magnetoresistance with no increase in the magnetostriction coefficient λ of the free magnetic layer.

In the present invention, the overall enhancement layer can have a lower magnetostriction coefficient λ in absolute value than the first enhancement layer if the first enhancement layer is made of Co or a CoFe-containing alloy and the second enhancement layer is made of a CoFe-containing alloy having a lower Co content than the material for the first enhancement layer.

For example, the first enhancement layer is made of a $Co_xFe_{100-x}$ alloy (wherein $90 \leq x \leq 100$ in atomic percent), and the second enhancement layer is made of a $Co_yFe_{100-y}$ alloy (wherein $70 \leq y \leq 88$ in atomic percent).

Patent Document 1 above discloses a free magnetic layer composed of a monolayer film of, for example, Co, a CoFe alloy, or a NiFe alloy or a multilayer film including two or more of such monolayer films. In addition, Patent Document 2 discloses a free magnetic layer having a three-layer structure including a CoFe layer, a NiFe layer, and another CoFe layer.

Neither of Patent Documents 1 and 2, however, discloses that the second enhancement layer is made of a CoFe-containing alloy having a lower Co content than the material for the first enhancement layer. For Patent Documents 1 and 2, therefore, the second enhancement layer cannot have a lower magnetostriction coefficient λ than the first enhancement layer.

The spin-dependent scattering coefficient increases with increasing amount of change in the mean free path of conduction electrons which occurs when the magnetization direction of the free magnetic layer shifts from parallel to antiparallel to that of the pinned magnetic layer.

The enhancement layer, which is made of a material with a higher spin-dependent scattering coefficient than the material for the low-coercivity layer, contributes to the increase in the rate of change in magnetoresistance of the magnetic sensing element.

In the present invention, the first enhancement layer, which is positioned closer to the nonmagnetic material layer, preferably has a higher spin-dependent scattering coefficient than the second enhancement layer.

In the present invention, additionally, the first enhancement layer preferably has a thickness of 10 to 20 Å.

The first and second enhancement layers preferably have a face-centered cubic structure with the (111) surface thereof preferentially oriented in a film plane direction.

The present invention further provides a magnetic sensing element including a multilayer film including a pinned magnetic layer whose magnetization direction is pinned in one direction and a free magnetic layer formed on the pinned magnetic layer with a nonmagnetic material layer disposed therebetween. The free magnetic layer includes a low-coercivity layer and an enhancement layer made of a material having a higher spin-dependent scattering coefficient than the material for the low-coercivity layer. The enhancement layer is disposed closer to the nonmagnetic material layer than the low-coercivity layer. The overall enhancement layer has a lower magnetostriction coefficient λ in absolute value than part of the enhancement layer in the vicinity of the interface with the nonmagnetic material layer.

In the present invention, the overall enhancement layer has a lower magnetostriction coefficient λ in absolute value than part of the enhancement layer in the vicinity of the interface with the nonmagnetic material layer. The magnetic sensing element can therefore achieve a higher rate of change in magnetoresistance with no increase in the magnetostriction coefficient λ of the free magnetic layer.

In the present invention, the overall enhancement layer can have a lower magnetostriction coefficient λ in absolute value than part of the enhancement layer in the vicinity of the interface with the nonmagnetic material layer if the enhancement layer is made of a CoFe-containing alloy and the Co content thereof decreases from the nonmagnetic material layer side to the low-coercivity layer side.

For example, the CoFe-containing alloy of the enhancement layer contains 90 to 100 atomic percent of Co in the vicinity of the interface with the nonmagnetic material layer and 70 to 88 atomic percent of Co in the vicinity of the interface with the low-coercivity layer.

The enhancement layer preferably has a face-centered cubic structure with the (111) surface thereof preferentially oriented in a film plane direction.

The low-coercivity layer, which has lower coercivity than the enhancement layer, may be made of, for example, a NiFe alloy.

In the present invention, the overall free magnetic layer preferably has a magnetostriction coefficient λ of 0 to 5 ppm, more preferably 0 to 4 ppm, still more preferably 2 to 3 ppm.

The present invention further provides a method for producing a magnetic sensing element including a multilayer film including a pinned magnetic layer whose magnetization direction is pinned in one direction and a free magnetic layer formed on the pinned magnetic layer with a nonmagnetic material layer disposed therebetween. This method includes the steps of (a) forming the pinned magnetic layer and the nonmagnetic material layer; and (b) forming a first enhancement layer, a second enhancement layer, and a low-coercivity layer on the nonmagnetic material layer to provide the free magnetic layer such that the overall enhancement layer has a lower magnetostriction coefficient λ in absolute value than the first enhancement layer. The first and second enhancement layers are formed with a material having a higher spin-dependent scattering coefficient than the material for the low-coercivity layer.

In the present invention, for example, the first enhancement layer is made of Co or a CoFe-containing alloy, and the second enhancement layer is made of a CoFe-containing alloy having a lower Co content than the material for the first enhancement layer.

For example, the first enhancement layer is made of a $Co_xFe_{100-x}$ alloy (wherein $90 \leq x \leq 100$ in atomic percent), and the second enhancement layer is made of a $Co_yFe_{100-y}$ alloy (wherein $70 \leq y \leq 88$ in atomic percent).

The first enhancement layer preferably has a higher spin-dependent scattering coefficient than the second enhancement layer.

The first enhancement layer preferably has a thickness of 10 to 20 Å.

The first and second enhancement layers preferably have a face-centered cubic structure with the (111) surface thereof preferentially oriented in a film plane direction.

DESCRIPTION OF THE PREFERRED EMBODIMENTS

Figure 1:
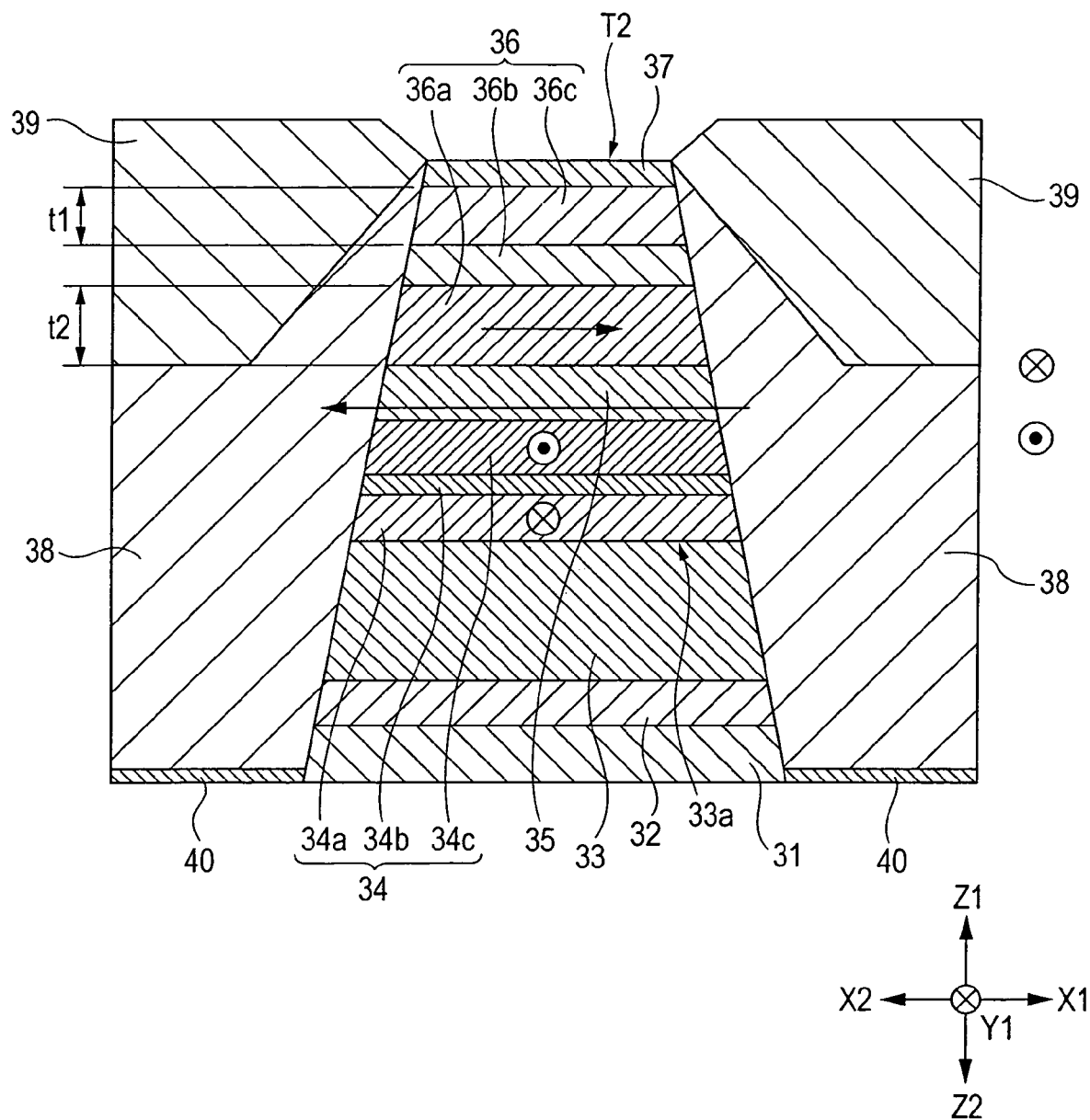
FIG. 1 is a partial sectional view of a magnetic sensing element according to a first embodiment of the present invention from a recording medium side.

FIG. 1 is a partial sectional view of a magnetic sensing element according to a first embodiment of the present invention from a recording medium side. FIG. 1 only shows the center of the element in a track-width direction (the X1-X2 direction in the drawing).

A base layer 31 is formed at the bottommost position in FIG. 1. This base layer 31 is made of a nonmagnetic material, for example, one or more elements selected from the group consisting of Ta, Hf, Nb, Zr, Ti, Mo, and W. The base layer 31 does not necessarily have to be formed.

A seed layer 32 is formed on the base layer 31 to increase the size of crystal grains in a direction parallel to the surfaces of a multilayer film T2. This allows for improvements in, for example, electrification reliability, typified by electromigration resistance, and the rate of change in magnetoresistance (ΔR/R). The seed layer 32 is made of, for example, a NiFeCr alloy, a NiCr alloy, or Cr.

An antiferromagnetic layer 33 is formed on the seed layer 32. This antiferromagnetic layer 33 is preferably made of an antiferromagnetic material containing element X (which indicates one or more elements selected from the group consisting of Pt, Pd, Ir, Rh, Ru, and Os) and Mn.

An X—Mn alloy, which contains a platinum-group element as described above, is an antiferromagnetic material with excellent properties including excellent corrosion resistance, a high blocking temperature, and the ability to increase an exchange coupling magnetic field ($H_{ex}$). Among platinum-group elements, Pt or Ir is particularly preferred; for example, a binary system such as a PtMn alloy or an IrMn alloy may be used.

In the present invention, alternatively, the antiferromagnetic layer 33 may be made of an antiferromagnetic material containing element X, element X' (which indicates one or more elements selected from the group consisting of Ne, Ar, Kr, Xe, Be, B, C, N, Mg, Al, Si, P, Ti, V, Cr, Fe, Co, Ni, Cu, Zn, Ga, Ge, Zr, Nb, Mo, Ag, Cd, Sn, Hf, Ta, W, Re, Au, Pb, and rare earth elements), and Mn.

A pinned magnetic layer 34 is formed on the antiferromagnetic layer 33. The pinned magnetic layer 34 has a multilayer ferrimagnetic pinned structure including a first pinned magnetic layer 34a in contact with a surface 33a of the antiferromagnetic layer 33 and a second pinned magnetic layer 34c formed on the first pinned magnetic layer 34a with a nonmagnetic intermediate layer 34b disposed therebetween. The first pinned magnetic layer 34a and the second pinned magnetic layer 34c are made of a magnetic material such as a NiFe alloy, Co, a CoNiFe alloy, a CoFe alloy, or a CoNi alloy. The nonmagnetic intermediate layer 34b is made of a nonmagnetic material such as Ru, Rh, Ir, Cr, Re, Cu, or an alloy thereof; Ru is particularly preferred. The first pinned magnetic layer 34a and the second pinned magnetic layer 34c have a total thickness of, for example, 6 Å. The total thickness correlates with the sum of the magnetization moments of the first pinned magnetic layer 34a and the second pinned magnetic layer 34c.

A nonmagnetic material layer 35 is formed on the pinned magnetic layer 34. The nonmagnetic material layer 35 is made of, for example, Cu, and has a thickness of 17 to 30 Å.

A free magnetic layer 36, which is a main component of the magnetic sensing element according to the present invention, will be described in detail later.

A protective layer 37 is composed of, for example, a laminate of a TaO layer and another TaO layer, a Ru layer, or a Ta layer, and has a thickness of 10 to 50 Å. The protective layer 37 functions to inhibit the oxidation of the multilayer film T2 and also as a diffusion-preventing layer.

In the embodiment shown in FIG. 1, bias base layers 40, hard bias layers 38, and electrode layers 39 are formed on both sides of the multilayer film T2, namely the layers from the seed layer 31 to the protective layer 37. The hard bias layers 38 generate a longitudinal bias field to put the magnetization of the free magnetic layer 36 into a single magnetic domain state in the track-width direction (the X1-X2 direction in the drawing).

The bias base layers 40 are made of, for example, Cr, W, or Ti. The hard bias layers 38 are made of, for example, a CoPt alloy or a CoCrPt alloy. The electrode layers 39 are made of, for example, Cr, Ta, Rh, Au, or W.

The bias base layers 40 have a thickness of 20 to 100 Å. The hard bias layers 38 have a thickness of 100 to 400 Å. The electrode layers 39 have a thickness of 400 to 1,500 Å.

An upper gap layer (not shown) made of an insulating material such as $Al_2O_3$ or AlSiO is formed on the electrode layers 39 and the protective layer 37. A lower shield layer (not shown) is provided below a lower gap layer (not shown) while an upper shield layer (not shown) is provided on the upper gap layer. The upper and lower shield layers are made of a soft magnetic material such as NiFe. The upper and lower gap layers each have a thickness of 50 to 300 Å.

The resistance across the electrode layers 39 changes depending on the relationship between the pinned magnetization direction of the second pinned magnetic layer 34c of the pinned magnetic layer 34 and the magnetization direction of the free magnetic layer 36, which is affected by external magnetic fields. The changes in resistance cause changes in voltage or current so that external signals from a recording medium are played back.

The features of this embodiment are described below.

The free magnetic layer 36 has a three-layer structure including a first enhancement layer 36a in contact with the nonmagnetic material layer 35, a second enhancement layer 36b, and a low-coercivity layer 36c.

The first enhancement layer 36a and the second enhancement layer 36b are made of a material with a higher spin-dependent scattering coefficient than the material for the low-coercivity layer 36c. The low-coercivity layer 36c is made of a material with lower coercivity than the materials for the first enhancement layer 36a and the second enhancement layer 36b.

The second enhancement layer 36b has a lower magnetostriction coefficient λ than the first enhancement layer 36a. The overall enhancement layer, which includes the first enhancement layer 36a and the second enhancement layer 36b, has a lower magnetostriction coefficient λ in absolute value than the first enhancement layer 36a.

In this embodiment, as described above, the overall enhancement layer has a bilayer structure including the first enhancement layer 36a and the second enhancement layer 36b, and exhibits a lower magnetostriction coefficient λ in absolute value than the first enhancement layer 36a because the second enhancement layer 36b has a lower magnetostriction coefficient λ than the first enhancement layer 36a. Such an enhancement layer can increase the rate of change in magnetoresistance with no increase in the magnetostriction coefficient λ of the free magnetic layer 36.

The first enhancement layer 36a is made of Co or a CoFe-containing alloy, and the second enhancement layer 36b is made of a CoFe-containing alloy having a lower Co content than the material for the first enhancement layer 36a, so that the second enhancement layer 36b can have a lower magnetostriction coefficient λ than the first enhancement layer 36a. For example, the first enhancement layer 36a is made of a $Co_xFe_{100-x}$ alloy (wherein $90 \leq x \leq 100$ in atomic percent), and the second enhancement layer 36b is made of a $Co_yFe_{100-y}$ alloy (wherein $70 \leq y \leq 88$ in atomic percent).

For example, the second enhancement layer 36b can have a lower magnetostriction coefficient λ than the first enhancement layer 36a if the first enhancement layer 36a is made of a $Co_{90}Fe_{10}$ alloy or Co and the second enhancement layer 36b is made of a $Co_{70}Fe_{30}$ alloy, a $Co_{88}Fe_{12}$ alloy, or a $Co_{86}Fe_{14}$ alloy.

As a result, the overall enhancement layer, which includes the first enhancement layer 36a and the second enhancement layer 36b, has a lower magnetostriction coefficient λ in absolute value than the first enhancement layer 36a.

The low-coercivity layer 36c, which has lower coercivity than the enhancement layers 36a and 36b, may be made of, for example, a NiFe alloy.

The first enhancement layer 36a and the second enhancement layer 36b preferably have a face-centered cubic structure with its (111) surface preferentially oriented in a film plane direction.

Patent Document 1 above discloses a free magnetic layer composed of a monolayer film of, for example, Co, a CoFe alloy, or a NiFe alloy or a multilayer film including two or more of such monolayer films. In addition, Patent Document 2 discloses a free magnetic layer having a three-layer structure including a CoFe layer, a NiFe layer, and another CoFe layer.

Neither of Patent Documents 1 and 2, however, discloses that the second enhancement layer 36b is made of a CoFe-containing alloy having a lower Co content than the material for the first enhancement layer 36a. For Patent Documents 1 and 2, therefore, the second enhancement layer 36b cannot have a lower magnetostriction coefficient λ than the first enhancement layer 36a.

The first enhancement layer 36a and the second enhancement layer 36b, which are made of a material with a higher spin-dependent scattering coefficient than the material for the low-coercivity layer 36c, contribute to the increase in the rate of change in magnetoresistance of the magnetic sensing element.

The spin-dependent scattering coefficient increases with increasing amount of change in the mean free path of conduction electrons which occurs when the magnetization direction of the free magnetic layer 36 shifts from parallel to antiparallel to that of the pinned magnetic layer 34.

In the present invention, the first enhancement layer 36a, which is positioned closer to the nonmagnetic material layer 35, preferably has a higher spin-dependent scattering coefficient than the second enhancement layer 36b. The use of the above materials for the enhancement layers 36a and 36b allows the first enhancement layer 36a to have a higher spin-dependent scattering coefficient than the second enhancement layer 36b.

In the present invention, additionally, the first enhancement layer 36a preferably has a thickness of 10 to 20 Å.

In the production of the magnetic sensing element shown in FIG. 1, the multilayer film T2 is provided by sequentially forming the base layer 31, the seed layer 32, the antiferromagnetic layer 33, the pinned magnetic layer 34, the nonmagnetic material layer 35, the first enhancement layer 36a, the second enhancement layer 36b, the low-coercivity layer 36c, and the protective layer 37 by, for example, sputtering. Both sides of the multilayer film T2 are then trimmed before the bias base layers 40, the hard bias layers 38, and the electrode layers 39 are formed.

Figure 2:
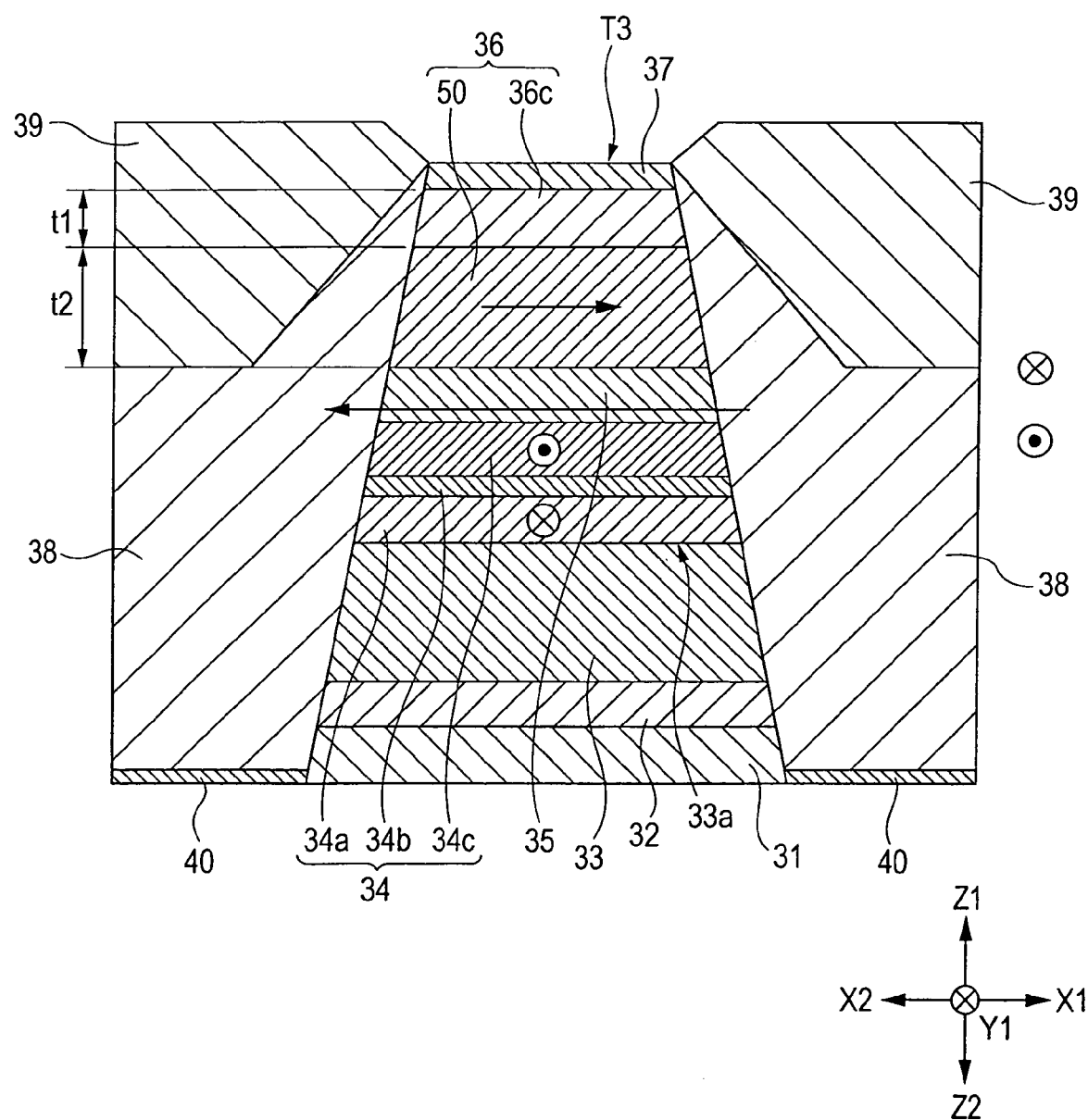
FIG. 2 is a partial sectional view of a magnetic sensing element according to a second embodiment of the present invention from a recording medium side.

The enhancement layer does not necessarily have to have a definite bilayer structure. Referring to FIG. 2, a single enhancement layer 50 may be provided which has such a composition gradient that the magnetostriction coefficient λ decreases gradually from the nonmagnetic material layer 35 side to the low-coercivity layer 36c side. The overall enhancement layer 50 has a lower magnetostriction coefficient λ in absolute value than part of the enhancement layer 50 in the vicinity of the interface with the nonmagnetic material layer 35. For example, the CoFe-containing alloy of the enhancement layer 50 contains 90 to 100 atomic percent of Co in the vicinity of the interface with the nonmagnetic material layer 35 and 70 to 88 atomic percent of Co in the vicinity of the interface with the low-coercivity layer 36c. Specifically, the enhancement layer 50 is made of a $Co_{90}Fe_{10}$ alloy or Co in the vicinity of the interface with the nonmagnetic material layer 35, decreases its Co content toward the low-coercivity layer 36c, and is made of a $Co_{70}Fe_{30}$ alloy, a $Co_{88}Fe_{12}$ alloy, or a $Co_{86}Fe_{14}$ alloy in the vicinity of the interface with the low-coercivity layer 36c. The enhancement layer 50 may be formed with such a composition gradient by sputtering a CoFe alloy target with a higher Co content in the vicinity of the interface with the nonmagnetic material layer 35 and a CoFe alloy target with a lower Co content in the vicinity of the interface with the low-coercivity layer 36c.

As a result, the magnetostriction coefficient λ and the spin-dependent scattering coefficient of the enhancement layer 50 decrease from the nonmagnetic material layer 35 side to the low-coercivity layer 36c side.

The enhancement layer 50 is made of a material with a higher spin-dependent scattering coefficient and higher coercivity than the material for the low-coercivity layer 36c, and is positioned closer to the nonmagnetic material layer 35 than the low-coercivity layer 36c.

In addition, the enhancement layer 50 preferably has a face-centered cubic structure with its (111) surface preferentially oriented in the film plane direction.

In the present invention, the overall free magnetic layer 36 preferably has a magnetostriction coefficient λ of 0 to 5 ppm, more preferably 0 to 4 ppm, still more preferably 2 to 3 ppm.

Figure 3:
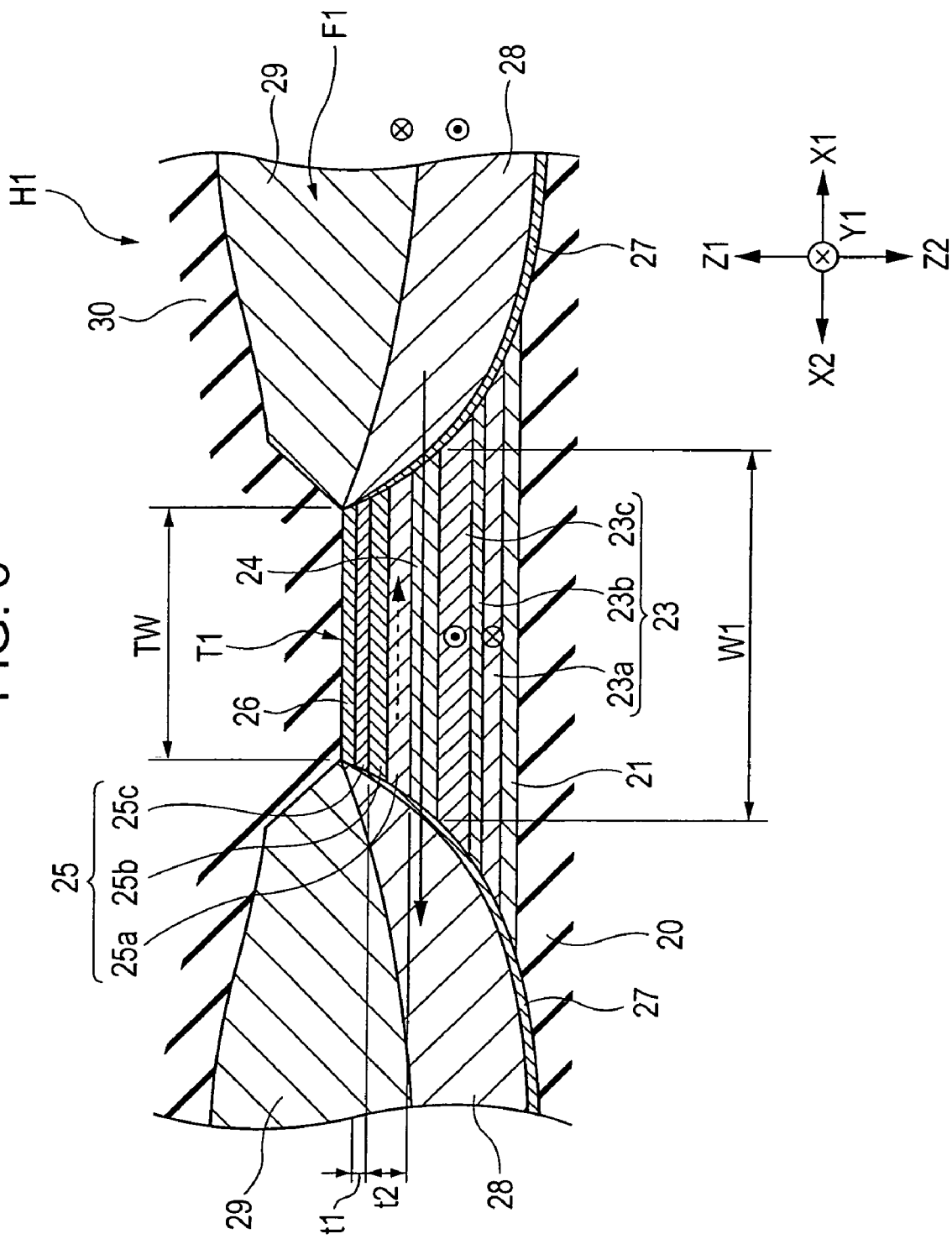
FIG. 3 is a partial sectional view of a magnetic sensing element according to a third embodiment of the present invention from a recording medium side.

FIG. 3 is a partial sectional view of a magnetic sensing element according to a third embodiment of the present invention from a recording medium side. FIG. 3 only shows the center of the element in a track-width direction (the X1-X2 direction in the drawing).

In FIG. 3, a magnetic sensing element H1 includes a lower gap layer 20 made of an insulating material such as alumina and a multilayer film T1 formed thereon.

In the embodiment shown in FIG. 3, the multilayer film T1 is provided by forming a seed layer 21, a pinned magnetic layer 23, a nonmagnetic material layer 24, a free magnetic layer 25, and a protective layer 26 in that order. In the embodiment shown in FIG. 3, no antiferromagnetic layer is formed below the pinned magnetic layer 23.

The seed layer 21 is made of, for example, a NiFe alloy, a NiFeCr alloy, Cr, or Ta.

The pinned magnetic layer 23 has a multilayer ferrimagnetic pinned structure including a first pinned magnetic layer 23a and a second pinned magnetic layer 23c formed thereon with a nonmagnetic intermediate layer 23b disposed therebetween. The first pinned magnetic layer 23a and the second pinned magnetic layer 23c in the pinned magnetic layer 23 are adjusted so that they yield positive magnetostriction. The magnetization direction of the second pinned magnetic layer 34c is pinned in a height direction (the Y1 direction in the drawing) by its own uniaxial anisotropy. The first pinned magnetic layer 23a and the second pinned magnetic layer 23c are made of a magnetic material such as a NiFe alloy, Co, a CoNiFe alloy, a CoFe alloy, or a CoNi alloy. The nonmagnetic intermediate layer 23b is made of a nonmagnetic material such as Ru, Rh, Ir, Cr, Re, Cu, or an alloy thereof; Ru is particularly preferred. The first pinned magnetic layer 23a and the second pinned magnetic layer 23c have a total thickness of, for example, 6 Å. The total thickness correlates with the sum of the magnetization moments of the first pinned magnetic layer 23a and the second pinned magnetic layer 23c.

The nonmagnetic material layer 24 serves to prevent the magnetic coupling of the pinned magnetic layer 23 and the free magnetic layer 25. The nonmagnetic material layer 24 is preferably made of a conductive nonmagnetic material such as Cu, Cr, Au, or Ag; Cu is particularly preferred. The nonmagnetic material layer 24 has a thickness of 7 to 30 Å.

The protective layer 26 is composed of, for example, a laminate of a TaO layer and another TaO layer, a Ru layer, or a Ta layer, and has a thickness of 10 to 50 Å. The protective layer 26 functions to inhibit the oxidation of the multilayer film T1 and also as a diffusion-preventing layer.

In the embodiment shown in FIG. 3, bias base layers 27 and hard bias layers 28 are formed on both sides of the multilayer film T1, namely the layers from the seed layer 21 to the protective layer 26, and electrode layers 29 are formed on the hard bias layers 28. The hard bias layers 28 generate a longitudinal bias field to put the magnetization of the free magnetic layer 25 into a single magnetic domain state in the track-width direction (the X1-X2 direction in the drawing).

The bias base layers 27 are made of, for example, Cr, W, or Ti. The hard bias layers 28 are made of, for example, a CoPt alloy or a CoCrPt alloy. The electrode layers 29 are made of, for example, Cr, Ta, Rh, Au, or W.

The bias base layers 27 have a thickness of 20 to 100 Å. The hard bias layers 28 have a thickness of 100 to 400 Å. The electrode layers 29 have a thickness of 400 to 1,500 Å.

An upper gap layer 30 made of an insulating material such as $Al_2O_3$ or AlSiO is formed on the electrode layers 29 and the protective layer 26. A lower shield layer (not shown) is provided below the lower gap layer 20 while an upper shield layer (not shown) is provided on the upper gap layer 30. The upper and lower shield layers are made of a soft magnetic material such as NiFe. The upper gap layer 30 and the lower gap layer 20 each have a thickness of 50 to 300 Å.

The resistance across the electrode layers 29 changes depending on the relationship between the pinned magnetization direction of the second pinned magnetic layer 23c of the pinned magnetic layer 23 and the magnetization direction of the free magnetic layer 25, which is affected by external magnetic fields. The changes in resistance cause changes in voltage or current so that external signals from a recording medium are played back.

The features of this embodiment are described below.

The free magnetic layer 25 has a three-layer structure including a first enhancement layer 25a in contact with the nonmagnetic material layer 24, a second enhancement layer 25b, and a low-coercivity layer 25c.

The first enhancement layer 25a and the second enhancement layer 25b are made of a material with a higher spin-dependent scattering coefficient than the material for the low-coercivity layer 25c. The low-coercivity layer 25c is made of a material with lower coercivity than the materials for the first enhancement layer 25a and the second enhancement layer 25b.

The second enhancement layer 25b has a lower magnetostriction coefficient $\lambda$ than the first enhancement layer 25a. The overall enhancement layer, which includes the first enhancement layer 25a and the second enhancement layer 25b, has a lower magnetostriction coefficient $\lambda$ in absolute value than the first enhancement layer 25a.

In this embodiment, as described above, the overall enhancement layer has a bilayer structure including the first enhancement layer 25a and the second enhancement layer 25b, and exhibits a lower magnetostriction coefficient $\lambda$ in absolute value than the first enhancement layer 25a. Such an enhancement layer can increase the rate of change in magnetoresistance with no increase in the magnetostriction coefficient $\lambda$ of the free magnetic layer 25.

The first enhancement layer 25a is made of Co or a CoFe-containing alloy, and the second enhancement layer 25b is made of a CoFe-containing alloy having a lower Co content than the material for the first enhancement layer 25a, so that the second enhancement layer 25b can have a lower magnetostriction coefficient $\lambda$ than the first enhancement layer 25a.

For example, the second enhancement layer 25b can have a lower magnetostriction coefficient $\lambda$ than the first enhancement layer 25a if the first enhancement layer 25a is made of a $Co_{90}Fe_{10}$ alloy or Co and the second enhancement layer 25b is made of a $Co_{70}Fe_{30}$ alloy, a $Co_{88}Fe_{12}$ alloy, or a $Co_{86}Fe_{14}$ alloy.

As a result, the overall enhancement layer, which includes the first enhancement layer 25a and the second enhancement layer 25b, has a lower magnetostriction coefficient $\lambda$ in absolute value than the first enhancement layer 25a.

The low-coercivity layer 25c, which has lower coercivity than the enhancement layers 25a and 25b, may be made of, for example, a NiFe alloy.

The first enhancement layer 25a and the second enhancement layer 25b, which are made of a material with a higher spin-dependent scattering coefficient than the material for the low-coercivity layer 25c, contribute to the increase in the rate of change in magnetoresistance of the magnetic sensing element H1.

The spin-dependent scattering coefficient increases with increasing amount of change in the mean free path of conduction electrons which occurs when the magnetization direction of the free magnetic layer 25 shifts from parallel to antiparallel to that of the pinned magnetic layer 23.

In the present invention, the first enhancement layer 25a, which is positioned closer to the nonmagnetic material layer 24, preferably has a higher spin-dependent scattering coefficient than the second enhancement layer 25b. The use of the above materials for the enhancement layers 25a and 25b allows the first enhancement layer 25a to have a higher spin-dependent scattering coefficient than the second enhancement layer 25b.

In the present invention, additionally, the first enhancement layer 25a preferably has a thickness of 10 to 20 Å.

The enhancement layer does not necessarily have to have a definite bilayer structure. A single enhancement layer may be provided which has such a composition gradient that the magnetostriction coefficient λ decreases gradually from the nonmagnetic material layer 24 side to the low-coercivity layer 25c side. The overall enhancement layer has a lower magnetostriction coefficient λ in absolute value than part of the enhancement layer in the vicinity of the interface with the nonmagnetic material layer 24.

For example, the enhancement layer is made of a $Co_{90}Fe_{10}$ alloy or Co in the vicinity of the interface with the nonmagnetic material layer 24, decreases its Co content toward the low-coercivity layer 25c, and is made of a $Co_{70}Fe_{30}$ alloy, a $Co_{88}Fe_{12}$ alloy, or a $Co_{86}Fe_{14}$ alloy in the vicinity of the interface with the low-coercivity layer 25c. As a result, the magnetostriction coefficient λ and the spin-dependent scattering coefficient of the enhancement layer decrease from the nonmagnetic material layer 24 side to the low-coercivity layer 25c side.

The enhancement layer is made of a material with a higher spin-dependent scattering coefficient and higher coercivity than the material for the low-coercivity layer 25c, and is positioned closer to the nonmagnetic material layer 24 than the low-coercivity layer 25c.

In the present invention, the overall free magnetic layer 25 preferably has a magnetostriction coefficient λ of 0 to 5 ppm, more preferably 0 to 4 ppm, still more preferably 2 to 3 ppm.

In the magnetic sensing elements shown in FIGS. 1 to 3, a ferromagnetic layer made of, for example, a NiFe alloy, Co, a CoNiFe alloy, a CoFe alloy, or a CoNi alloy may be formed on the free magnetic layer 36 or 25 with a nonmagnetic intermediate layer made of one or more elements selected from the group consisting of Ru, Rh, Ir, Cr, Re, and Cu disposed therebetween to form a multilayer ferrimagnetic structure.

EXAMPLES

Magnetic sensing elements were formed to study the relationships between the materials and thicknesses of the first and second enhancement layers of the free magnetic layers and the magnetostriction coefficients λ of the overall free magnetic layers, between the materials and thicknesses of the first and second enhancement layers of the free magnetic layers and the rates of change in magnetoresistance ΔR/R of the magnetic sensing elements, and between the magnetostriction coefficients λ of the overall free magnetic layers and the rates of change in magnetoresistance ΔR/R of the magnetic sensing elements. The magnetic sensing elements each included a substrate; a seed layer made of NiFeCr and having a thickness of 42 Å; an antiferromagnetic layer made of IrMn and having a thickness of 55 Å; a pinned magnetic layer including a $Co_{70}Fe_{30}$ layer with a thickness of 14 Å, a Ru layer with a thickness of 9.1 Å, and a $Co_{90}Fe_{10}$ layer with a thickness of 22 Å; a Cu layer with a thickness of 19 Å; a free magnetic layer including a first enhancement layer, a second enhancement layer, and a low-coercivity layer made of NiFe; and a protective layer made of Ta and having a thickness of 30 Å.

Figure 4:
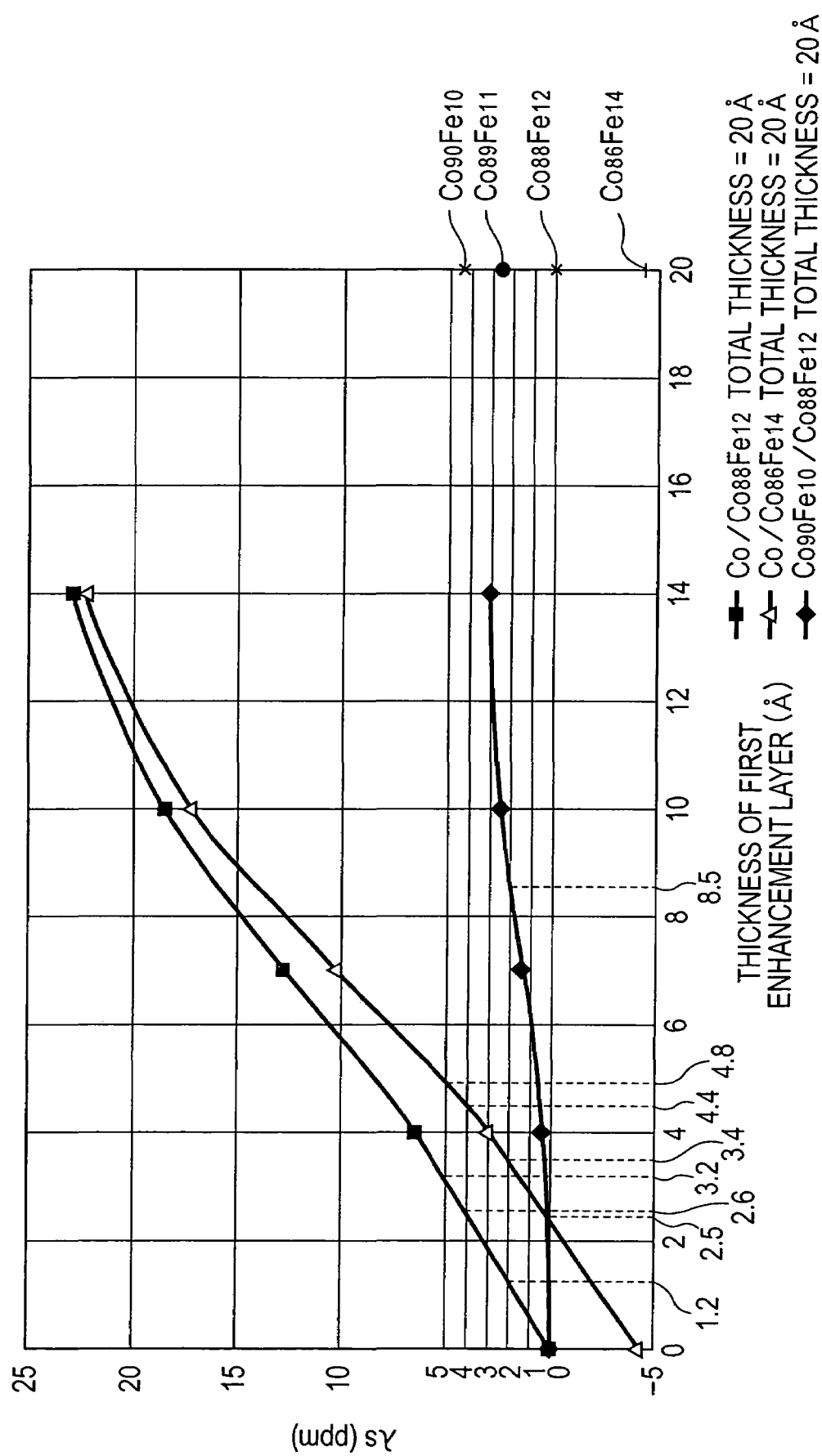
FIG. 4 is a graph showing the relationship between the materials and thicknesses of first and second enhancement layers of free magnetic layers and the magnetostriction coefficients λ of the overall free magnetic layers.

FIG. 4 shows the relationship between the materials and thicknesses of the first and second enhancement layers of the free magnetic layer and the magnetostriction coefficient λ of the overall free magnetic layer.

The first enhancement layer was made of Co or a $Co_{90}Fe_{10}$ alloy. The second enhancement layer was made of a $Co_{88}Fe_{12}$ alloy or a $Co_{86}Fe_{14}$ alloy. The first and second enhancement layers had a total thickness of 20 Å. The thickness of the low-coercivity layer (NiFe) was adjusted to 14 Å so that the free magnetic layer had a total thickness of 34 Å.

The magnetostriction coefficient λ of the overall free magnetic layer fell within the range of 0 to 5 ppm when the first enhancement layer was made of Co, the second enhancement layer was made of a $Co_{88}Fe_{12}$ alloy, and the first enhancement layer had a thickness of more than 0 Å to 3.2 Å; and when the first enhancement layer was made of Co, the second enhancement layer was made of a $Co_{86}Fe_{14}$ alloy, and the first enhancement layer had a thickness of 2.5 to 4.8 Å.

The magnetostriction coefficient λ of the overall free magnetic layer fell within the range of 2 to 3 ppm when the first enhancement layer was made of Co, the second enhancement layer was made of a $Co_{88}Fe_{12}$ alloy, and the first enhancement layer had a thickness of 1.2 to 2.0 Å; when the first enhancement layer was made of Co, the second enhancement layer was made of a $Co_{86}Fe_{14}$ alloy, and the first enhancement layer had a thickness of 3.4 to 4.0 Å; and when the first enhancement layer was made of a $Co_{90}Fe_{10}$ alloy, the second enhancement layer was made of a $Co_{88}Fe_{12}$ alloy, and the first enhancement layer had a thickness of 8.5 to 14 Å.

Figure 5:
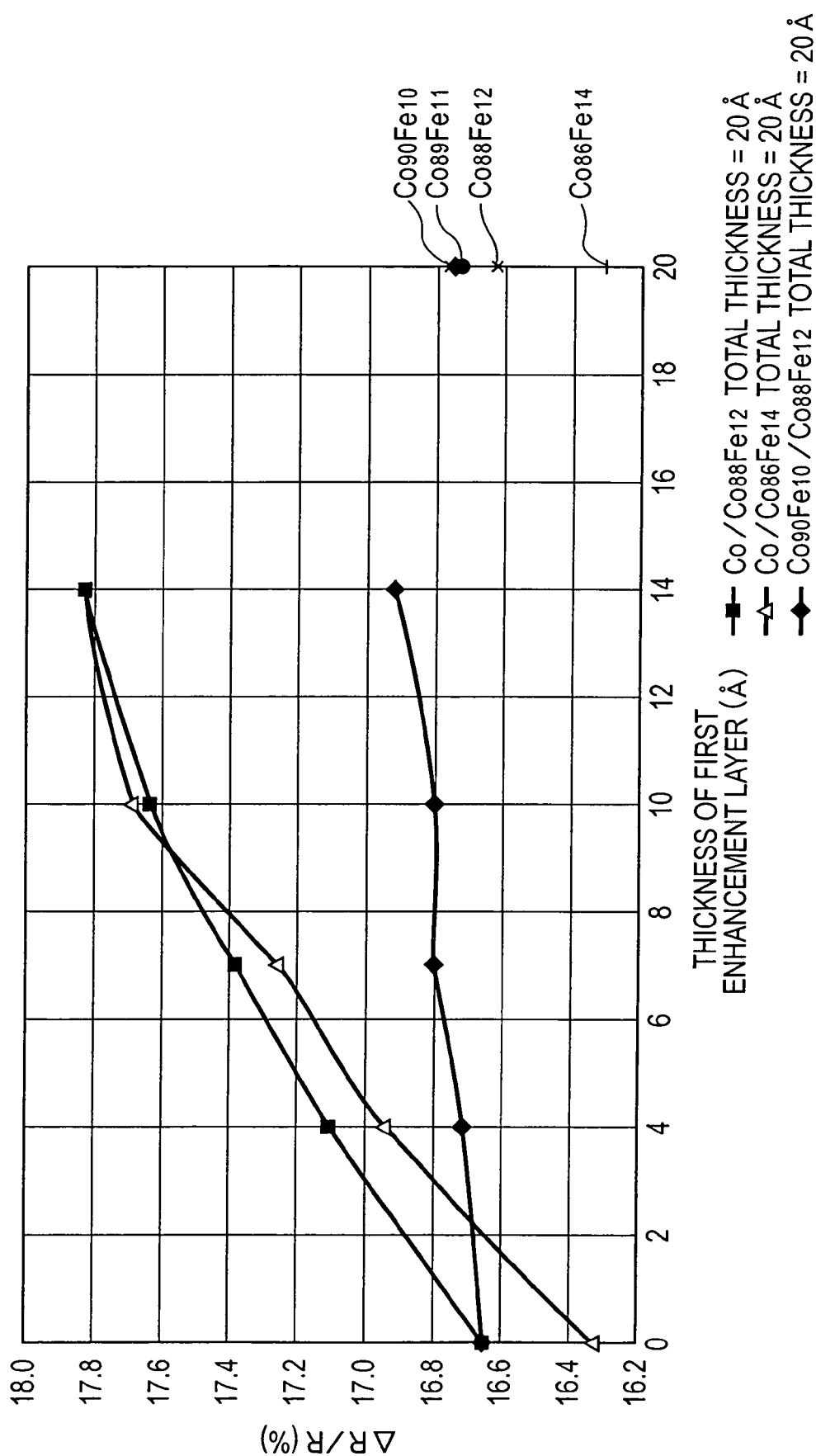
FIG. 5 is a graph showing the relationship between the materials and thicknesses of the first and second enhancement layers of the free magnetic layers and the rates of change in magnetoresistance ΔR/R of the magnetic sensing elements.

FIG. 5 shows the relationship between the materials and thicknesses of the first and second enhancement layers of the free magnetic layer and the rate of change in magnetoresistance ΔR/R of the magnetic sensing element.

Figure 6:
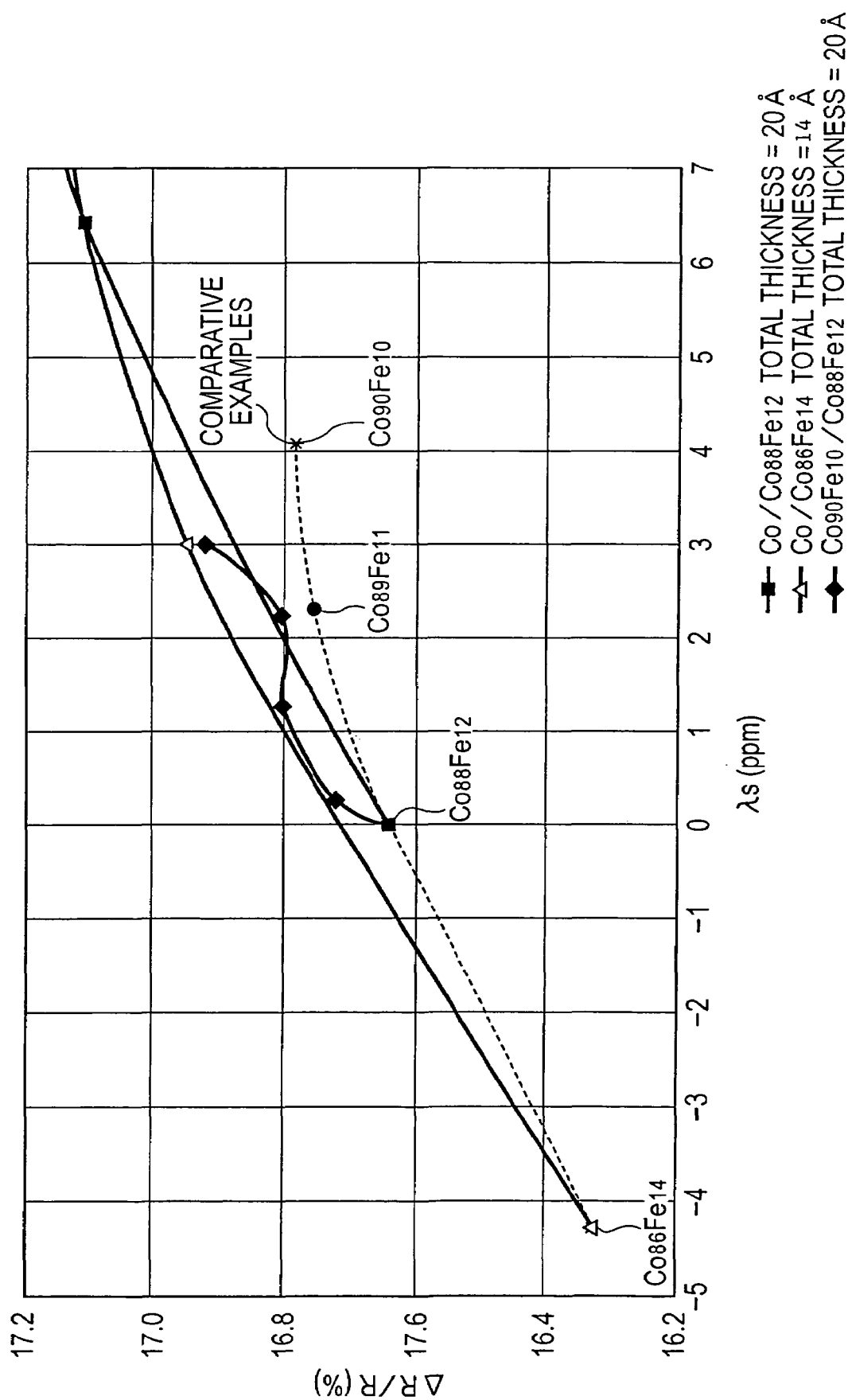
FIG. 6 is a graph showing the relationship between the magnetostriction coefficients λ of the overall free magnetic layers and the rates of change in magnetoresistance ΔR/R of the magnetic sensing elements.

FIGS. 4 and 5 were combined into FIG. 6, which shows the relationship between the magnetostriction coefficient λ of the overall free magnetic layer and the rate of change in magnetoresistance ΔR/R of the magnetic sensing element.

FIG. 6 shows that the above materials and thickness ranges can provide a higher rate of change in magnetoresistance ΔR/R than those in the related art while limiting the magnetostriction coefficient λ of the overall free magnetic layer within the range of 0 to 5 ppm or 2 to 3 ppm.

Figure 7:
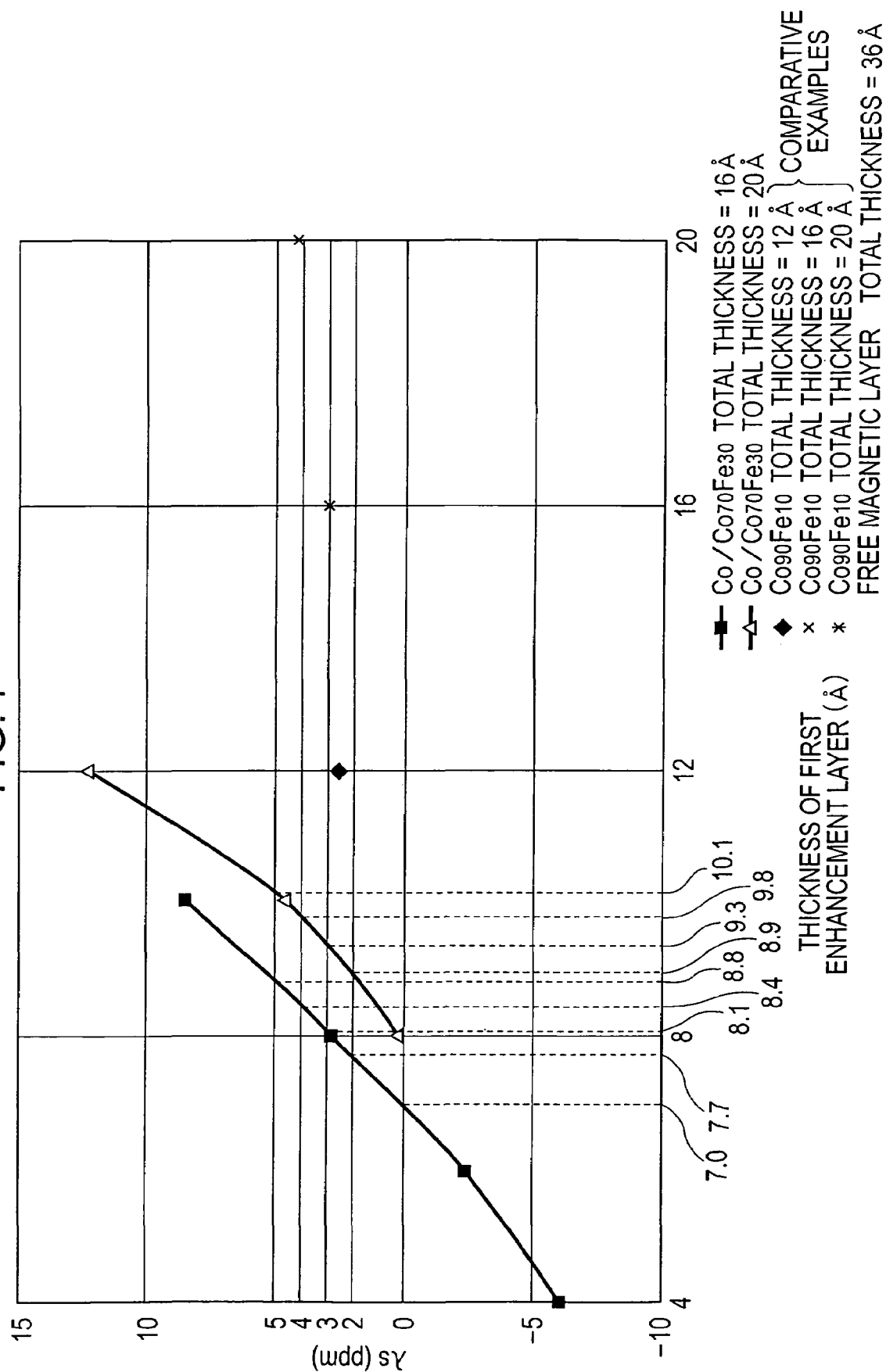
FIG. 7 is a graph showing the relationship between the materials and thicknesses of first and second enhancement layers of free magnetic layers and the magnetostriction coefficients λ of the overall free magnetic layers.

FIG. 7 shows the relationship between the materials and thicknesses of the first and second enhancement layers of the free magnetic layer and the magnetostriction coefficient λ of the overall free magnetic layer. The first enhancement layer was made of Co, and the second enhancement layer was made of a $Co_{70}Fe_{30}$ alloy. The thickness of the low-coercivity layer (NiFe) was adjusted so that the free magnetic layer had a total thickness of 36 Å.

The magnetostriction coefficient λ of the overall free magnetic layer fell within the range of 0 to 5 ppm when the first enhancement layer was made of Co, the second enhancement layer was made of a $Co_{70}Fe_{30}$ alloy, the first enhancement layer had a thickness of 7.0 to 8.8 Å, and the first and second enhancement layers had a total thickness of 16 Å; and when the first enhancement layer was made of Co, the second enhancement layer was made of a $Co_{70}Fe_{30}$ alloy, the first enhancement layer had a thickness of 8.0 to 10.1 Å, and the first and second enhancement layers had a total thickness of 20 Å.

The magnetostriction coefficient λ of the overall free magnetic layer fell within the range of 2 to 3 ppm when the first enhancement layer was made of Co, the second enhancement layer was made of a $Co_{70}Fe_{30}$ alloy, the first enhancement layer had a thickness of 7.7 to 8.1 Å, and the first and second enhancement layers had a total thickness of 16 Å; and when the first enhancement layer was made of Co, the second enhancement layer was made of a $Co_{70}Fe_{30}$ alloy, the first enhancement layer had a thickness of 8.9 to 9.3 Å, and the first and second enhancement layers had a total thickness of 20 Å.

Figure 8:
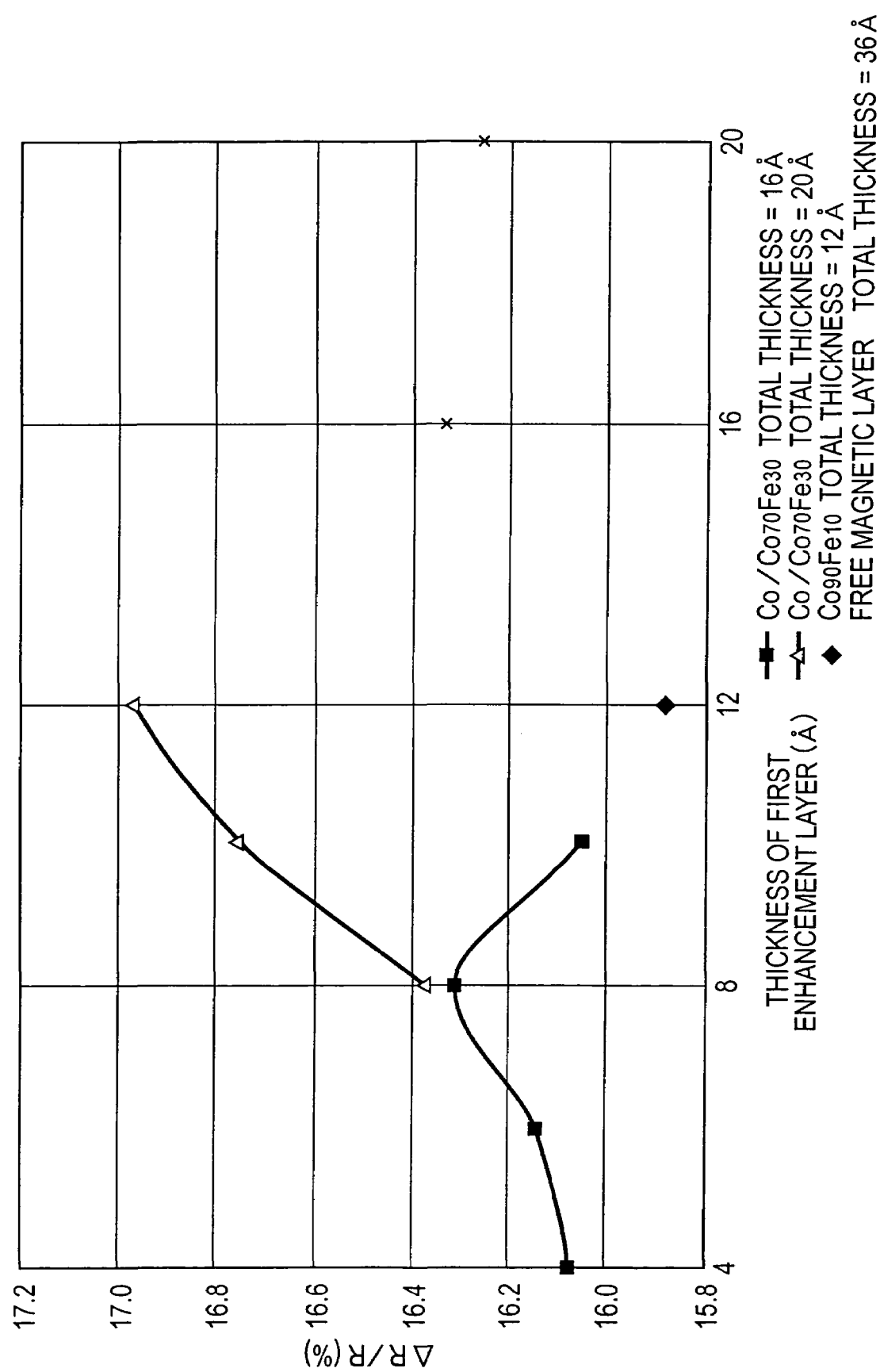
FIG. 8 is a graph showing the relationship between the materials and thicknesses of the first and second enhancement layers of the free magnetic layers and the rates of change in magnetoresistance ΔR/R of the magnetic sensing elements.

FIG. 8 shows the relationship between the materials and thicknesses of the first and second enhancement layers of the free magnetic layer and the rate of change in magnetoresistance ΔR/R of the magnetic sensing element.

Figure 9:
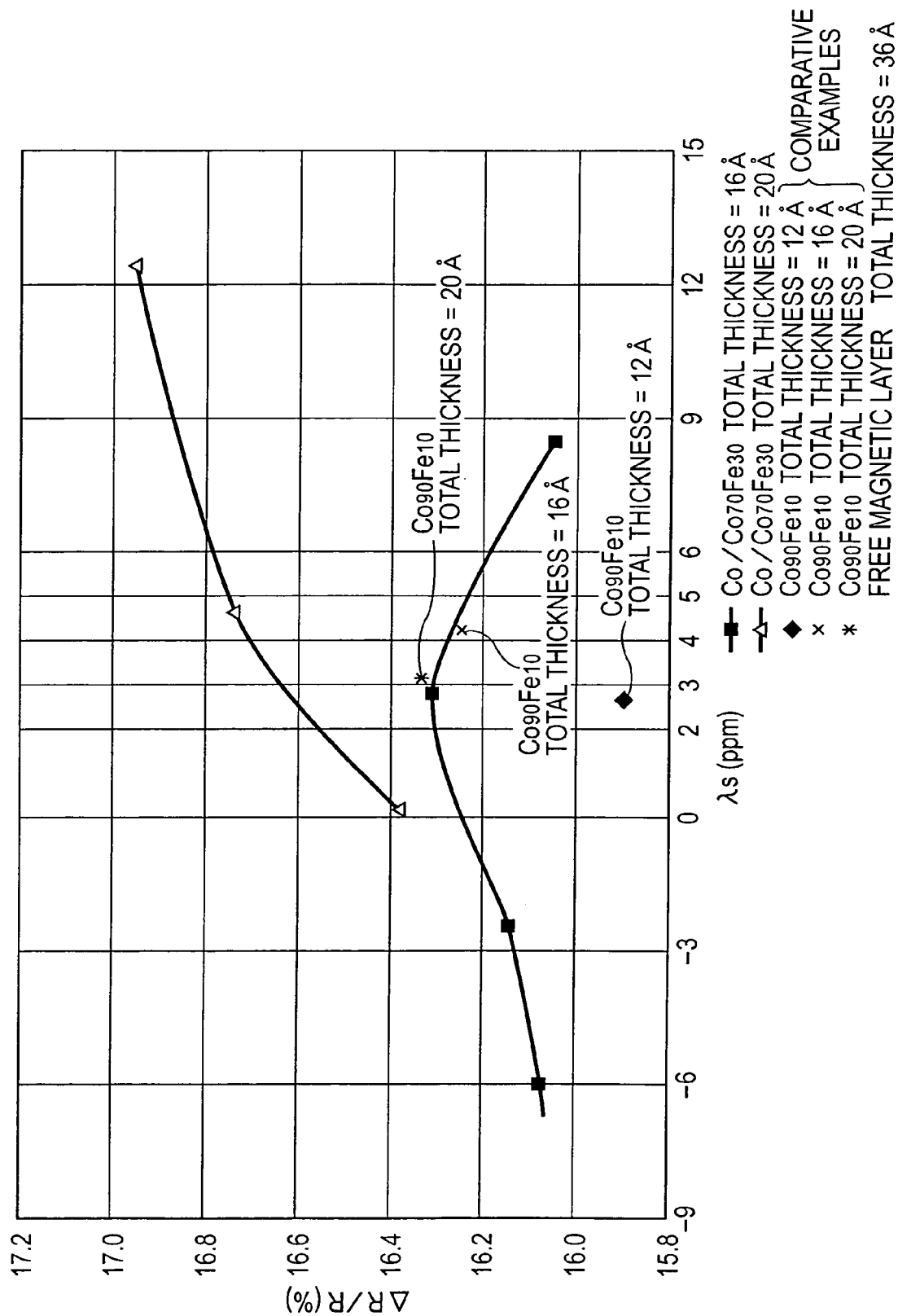
FIG. 9 is a graph showing the relationship between the magnetostriction coefficients λ of the overall free magnetic layers and the rates of change in magnetoresistance ΔR/R of the magnetic sensing elements.

FIGS. 7 and 8 were combined into FIG. 9, which shows the relationship between the magnetostriction coefficient λ of the overall free magnetic layer and the rate of change in magnetoresistance ΔR/R of the magnetic sensing element.

FIG. 9 shows that a first enhancement layer made of Co and a second enhancement layer made of a $Co_{70}Fe_{30}$ alloy that have a total thickness of 20 Å can provide a higher rate of change in magnetoresistance ΔR/R than those in the related art while limiting the magnetostriction coefficient λ of the overall free magnetic layer within the range of 0 to 5 ppm.

For single enhancement layers made of a $Co_{90}Fe_{10}$ alloy (comparative examples), the magnetostriction coefficient λ exceeds 3 ppm if they have a thickness of 16 Å or more. For double enhancement layers including a first enhancement layer made of Co and a second enhancement layer made of a $Co_{70}Fe_{30}$ alloy, on the other hand, the magnetostriction coefficient λ may be limited within the range of 2 to 3 ppm even if they have a total thickness of 16 Å.

Figure 10:
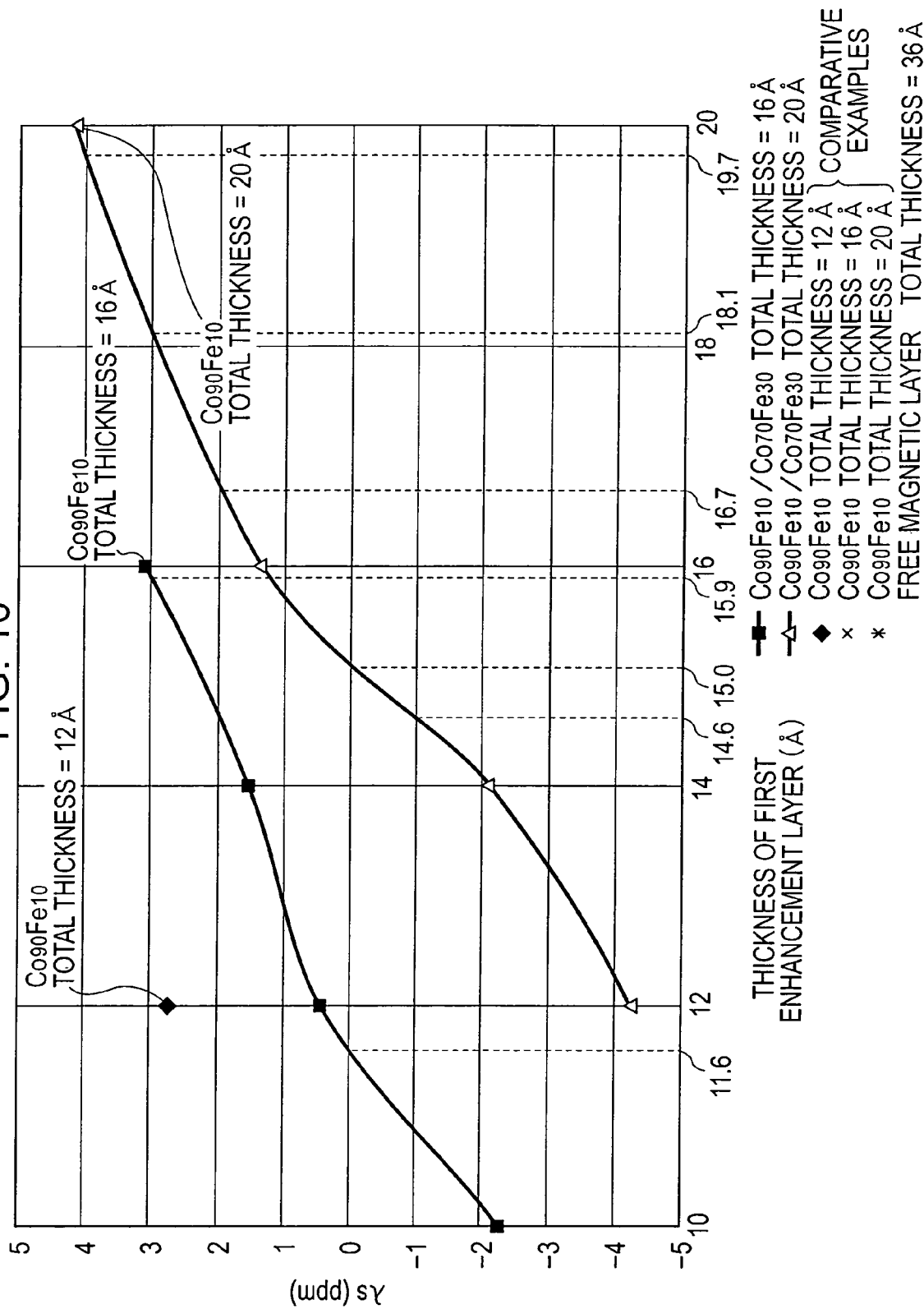
FIG. 10 is a graph showing the relationship between the materials and thicknesses of first and second enhancement layers of free magnetic layers and the magnetostriction coefficients λ of the overall free magnetic layers.

FIG. 10 shows the relationship between the materials and thicknesses of the first and second enhancement layers of the free magnetic layer and the magnetostriction coefficient λ of the overall free magnetic layer. The first enhancement layer was made of a $Co_{90}Fe_{10}$ alloy, and the second enhancement layer was made of a $Co_{70}Fe_{30}$ alloy. The thickness of the low-coercivity layer (NiFe) was adjusted so that the free magnetic layer had a total thickness of 36 Å.

The magnetostriction coefficient λ of the overall free magnetic layer fell within the range of 0 to 5 ppm when the first enhancement layer was made of a $Co_{90}Fe_{10}$ alloy, the second enhancement layer was made of a $Co_{70}Fe_{30}$ alloy, the first enhancement layer had a thickness of 11.6 Å or more, and the first and second enhancement layers had a total thickness of 16 Å; and when the first enhancement layer was made of a $Co_{90}Fe_{10}$ alloy, the second enhancement layer was made of a $Co_{70}Fe_{30}$ alloy, the first enhancement layer had a thickness of 15.0 Å or more, and the first and second enhancement layers had a total thickness of 20 Å.

The magnetostriction coefficient λ of the overall free magnetic layer fell within the range of 2 to 3 ppm when the first enhancement layer was made of a $Co_{90}Fe_{10}$ alloy, the second enhancement layer was made of a $Co_{70}Fe_{30}$ alloy, the first enhancement layer had a thickness of 14.6 to 15.9 Å, and the first and second enhancement layers had a total thickness of 16 Å; and when the first enhancement layer was made of a $Co_{90}Fe_{10}$ alloy, the second enhancement layer was made of a $Co_{70}Fe_{30}$ alloy, the first enhancement layer had a thickness of 16.7 to 18.1 Å, and the first and second enhancement layers had a total thickness of 20 Å.

Figure 11:
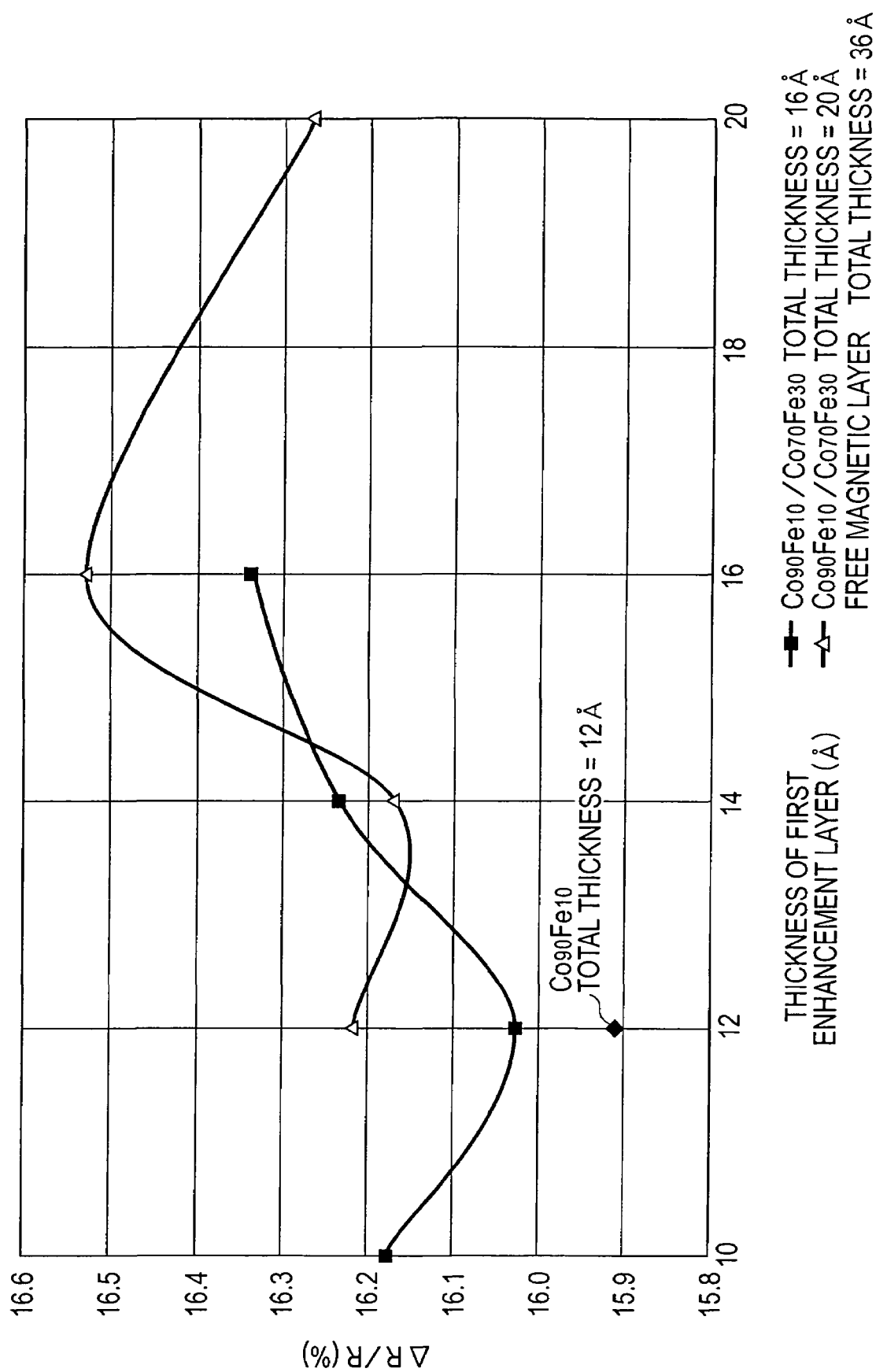
FIG. 11 is a graph showing the relationship between the materials and thicknesses of the first and second enhancement layers of the free magnetic layers and the rates of change in magnetoresistance ΔR/R of the magnetic sensing elements.

FIG. 11 shows the relationship between the materials and thicknesses of the first and second enhancement layers of the free magnetic layer and the rate of change in magnetoresistance ΔR/R of the magnetic sensing element.

Figure 12:
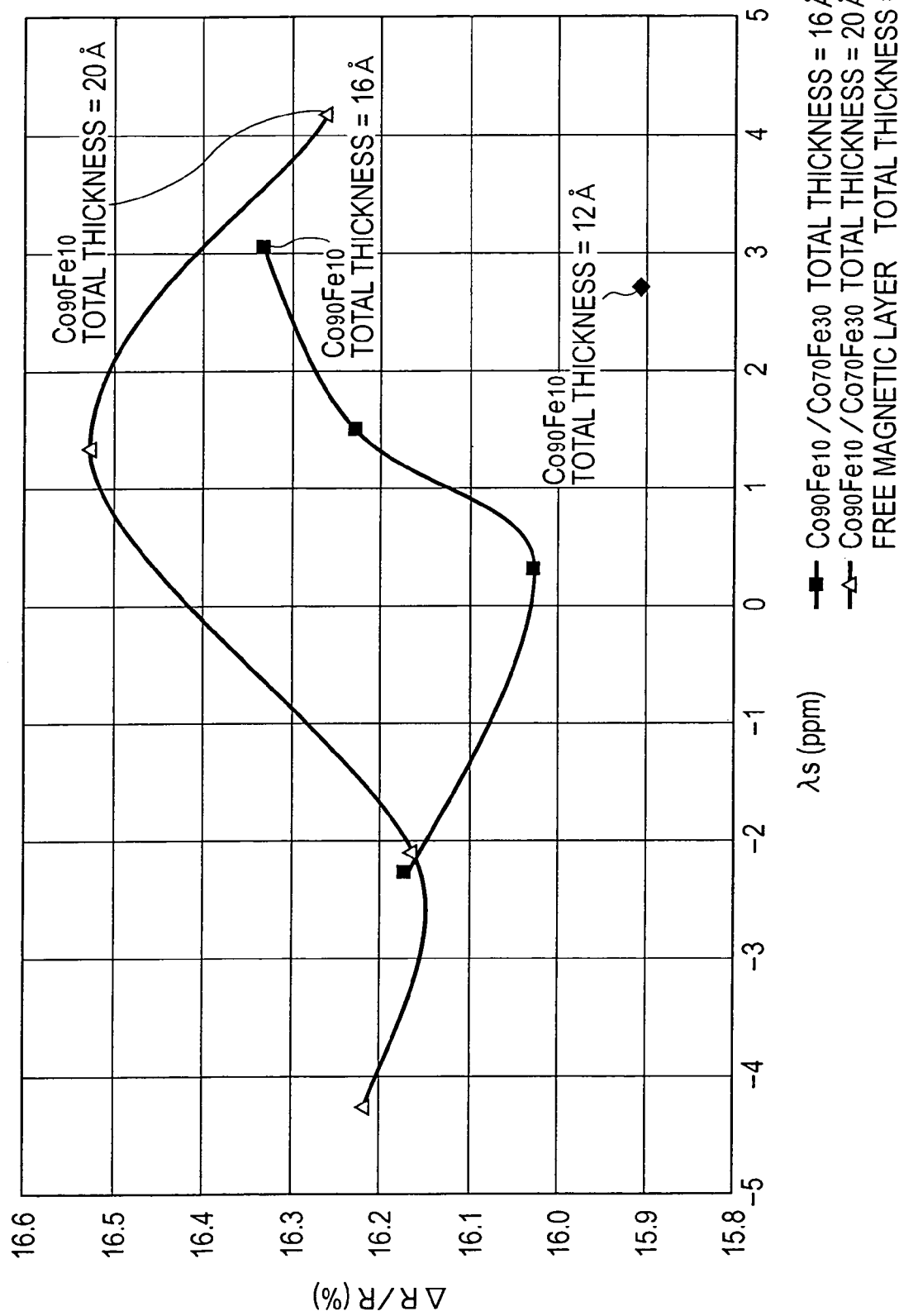
FIG. 12 is a graph showing the relationship between the magnetostriction coefficients λ of the overall free magnetic layer and the rates of change in magnetoresistance ΔR/R of the magnetic sensing elements.
Figure 13:
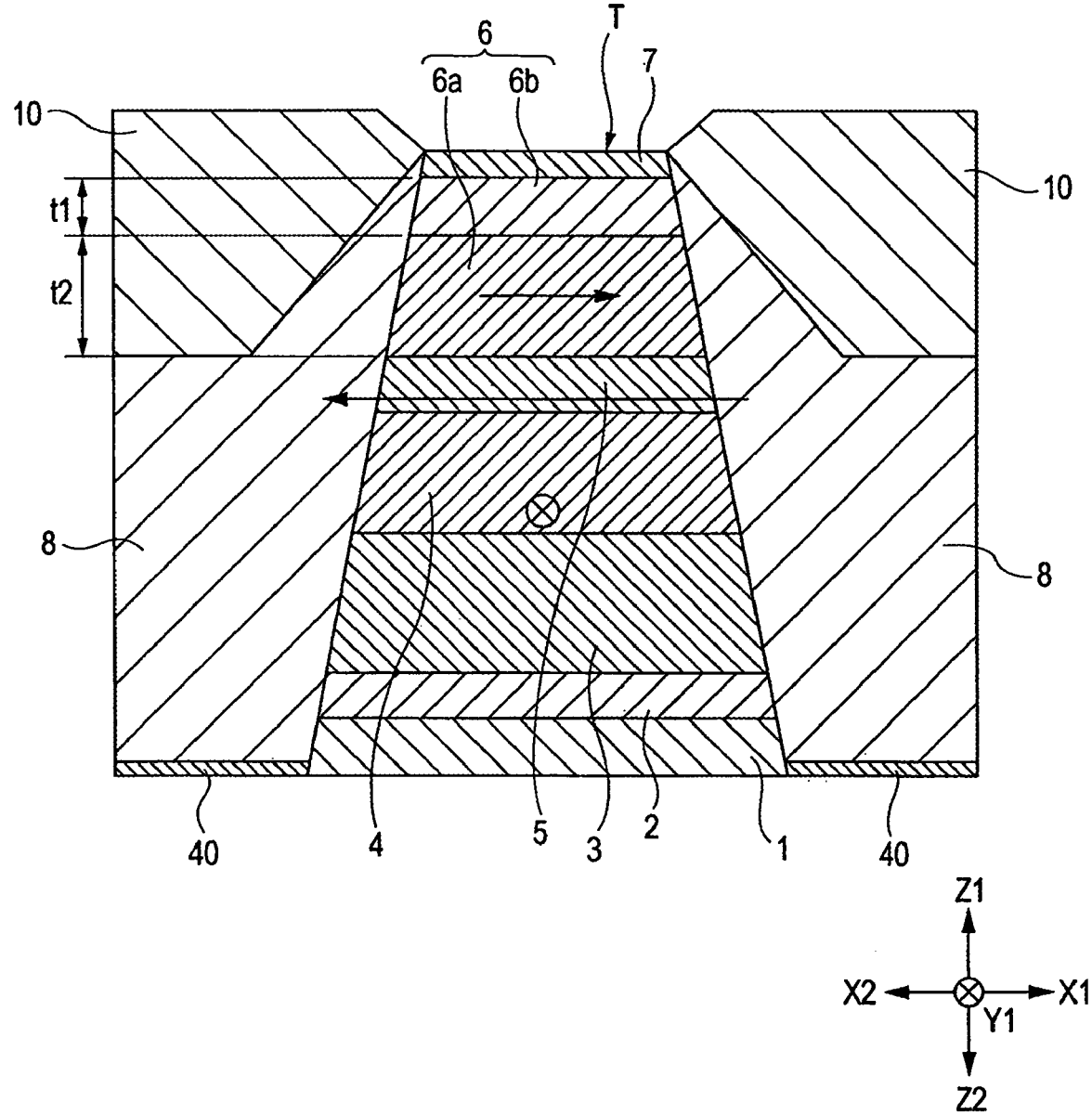
FIG. 13 a partial sectional view of a known magnetic sensing element from a recording medium side.

FIGS. 10 and 11 were combined into FIG. 12, which shows the relationship between the magnetostriction coefficient λ of the overall free magnetic layer and the rate of change in magnetoresistance ΔR/R of the magnetic sensing element.

For single enhancement layers made of a $Co_{90}Fe_{10}$ alloy (comparative examples), the magnetostriction coefficient λ exceeds 3 ppm if they have a thickness of 16 Å or more. For double enhancement layers including a first enhancement layer made of a $Co_{90}Fe_{10}$ alloy and a second enhancement layer made of a $Co_{70}Fe_{30}$ alloy, on the other hand, the magnetostriction coefficient λ may be limited within the range of 2 to 3 ppm even if they have a total thickness of 16 Å.

What is claimed is:

1. A magnetic sensing element comprising a multilayer film including a pinned magnetic layer whose magnetization direction is pinned in one direction and a free magnetic layer formed on the pinned magnetic layer with a nonmagnetic material layer disposed therebetween, the free magnetic layer including a low-coercivity layer and an enhancement layer comprising a material having a higher spin-dependent scattering coefficient than the material for the low-coercivity layer, the enhancement layer being disposed closer to the nonmagnetic material layer than the low-coercivity layer, the enhancement layer including a first enhancement layer and a second enhancement layer, the first enhancement layer being disposed closer to the nonmagnetic material layer than the second enhancement layer, the overall enhancement layer having a lower magnetostriction coefficient λ in absolute value than the first enhancement layer, wherein the first enhancement layer comprises Co or a CoFe-containing alloy, and the second enhancement layer comprises a CoFe-containing alloy having a lower Co content than the material for the first enhancement layer, the first enhancement layer comprises a $Co_xFe_{100-x}$ alloy (wherein $90 \leq x \leq 100$ in atomic percent), and the second enhancement layer comprises a $Co_yFe_{100-y}$ alloy (wherein $70 \leq y \leq 88$ in atomic percent) and the overall free magnetic layer has a magnetostriction coefficient λ of 0 to 5 ppm.

2. The magnetic sensing element according to claim 1, wherein the first enhancement layer has a higher spin-dependent scattering coefficient than the second enhancement layer.

3. The magnetic sensing element according to claim 1, wherein the first enhancement layer has a thickness of 10 to 20 Å.

4. The magnetic sensing element according to claim 1, wherein the first and second enhancement layers have a face-centered cubic structure with the (111) surface thereof preferentially oriented in a film plane direction.

5. The magnetic sensing element according to claim 1, wherein the low-coercivity layer comprises a NiFe alloy.

6. The magnetic sensing element according to claim 1, wherein the overall free magnetic layer has a magnetostriction coefficient λ of 2 to 3 ppm.

7. A magnetic sensing element comprising a multilayer film including a pinned magnetic layer whose magnetization direction is pinned in one direction and a free magnetic layer formed on the pinned magnetic layer with a nonmagnetic material layer disposed therebetween, the free magnetic layer including a low-coercivity layer and an enhancement layer comprising a material having a higher spin-dependent scattering coefficient than the material for the low-coercivity layer, the enhancement layer being disposed closer to the nonmagnetic material layer than the low-coercivity layer, the overall enhancement layer having a lower magnetostriction coefficient Å in absolute value than part of the enhancement layer in the vicinity of an interface with the nonmagnetic material layer, wherein the enhancement layer comprises a CoFe-containing alloy, and the Co content thereof decreases from the nonmagnetic material layer side to the low-coercivity layer side, the CoFe-containing alloy of the enhancement layer contains 90 to 100 atomic percent of Co in the vicinity of the interface with the nonmagnetic material layer and 70 to 88 atomic percent of Co in the vicinity of an interface with the low-coercivity layer, and the overall free magnetic layer has a macinetostriction coefficient Å of 0 to 5 ppm.

8. The magnetic sensing element according to claim 7, wherein the enhancement layer has a face-centered cubic structure with the (111) surface thereof preferentially oriented in a film plane direction.

9. A method for producing a magnetic sensing element including a multilayer film including a pinned magnetic layer whose magnetization direction is pinned in one direction and a free magnetic layer formed on the pinned magnetic layer with a nonmagnetic material layer disposed therebetween, the method comprising the steps of:

(a) forming the pinned magnetic layer and the nonmagnetic material layer; and (b) forming a first enhancement layer, a second enhancement layer, and a low-coercivity layer on the nonmagnetic material layer to provide the free magnetic layer such that the overall enhancement layer has a lower magnetostriction coefficient $\lambda$ in absolute value than the first enhancement layer, the first and second enhancement layers being formed with a material having a higher spin-dependent scattering coefficient than the material for the low-coercivity layer, wherein the first enhancement layer comprises Co or a CoFe-containing alloy, and the second enhancement layer comprises a CoFe-containing alloy having a lower Co content than the material for the first enhancement layer, the first enhancement layer comprises a $Co_xFe_{100-x}$ alloy (wherein $90 \leqq x \leqq 100$ in atomic percent), and the second enhancement layer comprises a $Co_yFe_{100-y}$ alloy (wherein $70 \leqq y \leqq 88$ in atomic percent) and the overall free magnetic layer has a magnetostriction coefficient $\lambda$ of 0 to 5 ppm.

10. The magnetic sensing element according to claim 9, wherein the first enhancement layer has a higher spin-dependent scattering coefficient than the second enhancement layer.

11. The magnetic sensing element according to claim 9, wherein the first enhancement layer has a thickness of 10 to 20 Å.

12. The magnetic sensing element according to claim 9, wherein the first and second enhancement layers have a face-centered cubic structure with the (111) surface thereof preferentially oriented in a film plane direction.

* * * * *

UNITED STATES PATENT AND TRADEMARK OFFICE
CERTIFICATE OF CORRECTION

PATENT NO. : 7,567,412 B2 Page 1 of 1
APPLICATION NO. : 11/266956
DATED : July 28, 2009
INVENTOR(S) : Ryo Nakabayashi et al.

It is certified that error appears in the above-identified patent and that said Letters Patent is hereby corrected as shown below:

In the Claims

In column 15, claim 7, lines 3-4, after "layer comprises a" replace "CoFe-containinci" with --CoFe-containing--.

In column 15, claim 7, line 5, before "material layer side" replace "nonmacinetic" with --nonmagnetic--.

Signed and Sealed this

Second Day of February, 2010

David J. Kappos
*Director of the United States Patent and Trademark Office*

UNITED STATES PATENT AND TRADEMARK OFFICE
CERTIFICATE OF CORRECTION

PATENT NO. : 7,567,412 B2  Page 1 of 1
APPLICATION NO. : 11/266956
DATED : July 28, 2009
INVENTOR(S) : Nakabayashi et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 775 days.

Signed and Sealed this

Seventh Day of September, 2010

David J. Kappos
*Director of the United States Patent and Trademark Office*